US012688795B2

(12) United States Patent
Park et al.

(10) Patent No.: US 12,688,795 B2
(45) Date of Patent: Jul. 21, 2026

(54) PHANTOM MODEL OF TEETH SET, METHOD OF EVALUATING SCANNING PRECISION OF SCANNER USING THE SAME, AND METHOD OF EVALUATING 3D PRINTING PRECISION USING THE SAME

(71) Applicant: ODS CO., LTD., Incheon (KR)

(72) Inventors: June Beom Park, Incheon (KR); Mi Young Shim, Incheon (KR)

(73) Assignee: ODS CO., LTD., Incheon (KR)

( * ) Notice: Subject to any disclaimer, the term of this patent is extended or adjusted under 35 U.S.C. 154(b) by 751 days.

(21) Appl. No.: 18/013,545

(22) PCT Filed: Aug. 30, 2021

(86) PCT No.: PCT/KR2021/011604
§ 371 (c)(1),
(2) Date: Dec. 28, 2022

(87) PCT Pub. No.: WO2022/065719
PCT Pub. Date: Mar. 31, 2022

(65) Prior Publication Data
US 2023/0298484 A1    Sep. 21, 2023

(30) Foreign Application Priority Data
Sep. 23, 2020    (KR) ........................ 10-2020-0123332

(51) Int. Cl.
*G09B 23/28*        (2006.01)
*G01B 11/24*        (2006.01)
*G06F 30/17*        (2020.01)

(52) U.S. Cl.
CPC ............ *G09B 23/283* (2013.01); *G01B 11/24* (2013.01); *G06F 30/17* (2020.01)

(58) Field of Classification Search
CPC ....... G09B 23/283; G01B 11/24; G06F 30/17; A61C 13/0004; A61C 9/0053;
(Continued)

(56) References Cited

U.S. PATENT DOCUMENTS 4,242,812 A *   1/1981   Randoll ............... G09B 23/283
                                                        434/263
9,501,954 B2 *  11/2016  Higashimura ....... G09B 23/283
(Continued)

FOREIGN PATENT DOCUMENTS

CN          110057545 A  *  7/2019  ............ G01M 11/00
JP          2017-524448 A     8/2017
(Continued)

OTHER PUBLICATIONS

Machine translation of CN-110057545-A (Year: 2019).*

*Primary Examiner* — Seung C Sohn
(74) *Attorney, Agent, or Firm* — You & IP, LLC

(57) ABSTRACT

A phantom model of teeth set, a method for evaluating the scanning accuracy of a scanner using the same model, and a method for evaluating the 3D printing precision of a printer using the same model is disclosed. The disclosed phantom model of teeth set comprises a base layer and a layer of teeth set comprising a tooth model as positioned on the base layer, and the tooth model may be constructed such that a shape observed in one direction differs from shapes viewed in the other direction.

10 Claims, 11 Drawing Sheets

(58) Field of Classification Search
      CPC ........ A61C 9/008; A61C 13/34; G16H 30/40;
               G16H 50/50; B33Y 50/02; B33Y 80/00;
                                      G06T 17/20
      See application file for complete search history.

(56)                     References Cited

U.S. PATENT DOCUMENTS

| | | | |
|---|---|---|---|
| 10,123,706 B2 * | 11/2018 | Elbaz ................. | G06F 16/9535 |
| 10,258,441 B2 | 4/2019 | Boehm et al. | |
| 11,464,607 B2 * | 10/2022 | Goto ..................... | A61C 9/002 |
| 11,751,981 B2 * | 9/2023 | Fisker ................... | A61C 19/05 |
| | | | 703/11 |
| 2017/0027673 A1 | 2/2017 | Beom et al. | |

FOREIGN PATENT DOCUMENTS

| | | | |
|---|---|---|---|
| KR | 10-2015-0120033 A | 10/2015 |
| KR | 10-2019-0037557 A | 4/2017 |
| KR | 10-2018-0131471 A | 12/2018 |
| KR | 10-2020-0042068 A | 4/2020 |
| KR | 10-2268060 B1 | 6/2021 |

* cited by examiner

PHANTOM MODEL OF TEETH SET, METHOD OF EVALUATING SCANNING PRECISION OF SCANNER USING THE SAME, AND METHOD OF EVALUATING 3D PRINTING PRECISION USING THE SAME

TECHNICAL FIELD

This relates to the Phantom model of teeth set, the method of evaluating the scanning precision of scanners using the same, and the method of evaluating the 3D printing precision using the same. Specifically, a phantom model of teeth set capable of reliably assessing the accuracy of a scanner, a scanning precision evaluation technique for a scanner using the same dental phantom model, and a 3D printing precision evaluation method utilizing the same phantom model of teeth set is disclosed.

BACKGROUND TECHNOLOGY

An intraoral scanner might serve as an alternative to conventional dental impressions. Essentially, such intraoral scanners should be able to provide accurate scans.

There is a technique for evaluating the precision of intraoral scanners that involves assessing the average deviation in distance between data from repeated scans and deciding that the precision of the intraoral scanner is superior when the average deviation in distance decreases. However, measuring the average value may lead to incorrect results and clinical judgments by underestimating the error.

Simulating natural dentition to generate a rubber imprint stone model and scanning it with a non-contact extraoral scanner is another way used to verify the precision of intraoral scanners (in particular, the model scanner). After receiving the scan data and the oral scanner's scan data sequentially, there is a technique for determining that the intraoral scanner's accuracy is excellent based on the difference between these scan data is minimal. However, comparing the scan data of the model scanner with the scan data of the intraoral scanner will result in a comparison of two models with different originals, as the scan data of the model scanner has a large amount of error because the rubber impression stone model itself deviates from the original intraoral (i.e., actual human teeth set). As a consequence, measuring the precision of the intraoral scanner based on the data of the model scanner and the data of the intraoral scanner acquired by scanning the rubber impression stone model, which should be considered different from the original, may result in an incorrect assessment.

Therefore, there is an urgent need to construct a phantom model of a teeth set that can precisely establish the precision of both the intraoral scanner and the non-contact extraoral scanner.

SUMMARY OF THE INVENTION

Technical Problem

A phantom model of teeth set capable of appropriately assessing the scanning precision of a scanner is provided as one embodiment of the present invention.

Using the phantom model of teeth set, another aspect of the present invention provides a technique for measuring the scanning precision of a scanner.

A further aspect of the present invention provides a method for evaluating 3D printing precision using the phantom model of teeth set.

Technical Solution

One aspect of the present invention is the base layer; and as disposed on the top of the base layer, it includes a dental layer comprising a tooth model, and this tooth model provides a phantom model of teeth set so that the form perceived in one direction differs from the shape observed in the opposite way.

The tooth model may incorporate three-dimensional position data. The phantom model of teeth set may comprise several tooth models, each of which may be set such that a shape observed in a random direction differs from shapes of other tooth models viewed in a random direction.

Each of the tooth models may be constructed so that the forms observed from the front, back, planar left, and right sides of the phantom model of teeth set are different from the shapes viewed from the front, back, planar left and right sides of the other tooth models.

The basal layer can be formed to resemble human gum. The base layer may include a first base layer and a second base layer, wherein the second base layer is created to be stepped on the first base layer, and the layer of teeth set is positioned on the second base layer. The phantom model of teeth set may also have a pattern placed on at least one of the tooth models and the base layer. Both the base layer and tooth model may contain metal.

Another aspect of the present invention is, using a CAD application to create a virtual phantom model of teeth set using three-dimensional position data (S10-1); utilizing a 3D processing approach to create an actual phantom model of teeth set based on the sketched virtual phantom model of teeth set (S20-1); acquiring scan data by scanning a made actual phantom model of teeth set with a non-contact extraoral scanner (S30-1); and by comparing the scan data of the non-contact extraoral scanner with the three-dimensional position data of the virtual dental phantom model, a method of measuring the scanning precision of the scanner is provided (S40-1).

In the method for evaluating the scanning precision of the scanner, the actual phantom model of teeth set manufactured in step (S20-1) is scanned with a contact extraoral scanner between steps (S20-1) and (S30-1), and further includes the step (S25) of obtaining the three-dimensional position data of the actual phantom model of teeth set. Instead of comparing the scan data of the non-contact extraoral scanner with the three-dimensional position data of the virtual phantom model of teeth set at step S40-1, the scanning precision of the non-contact extraoral scanner may be evaluated by comparing the scan data with the three-dimensional position data of the actual phantom model of teeth set. After step (S40-1), the scanning precision evaluation method for the scanner involves scanning the actual phantom model of teeth set created in step (S20-1) using an intraoral scanner to gather scan data (S50-1). It may also include the step of evaluating the scanning precision of the intraoral scanner (S60-1) by comparing the obtained scan data of the intraoral scanner with the scan data of the non-contact extraoral scanner obtained in step (S30-1).

Another aspect of the present invention is, using a CAD application to create a virtual phantom model of teeth set using three-dimensional position data (S10-2); 3D-printing a physical phantom model of teeth set based on the drawn virtual phantom model of teeth set (S20-1); collecting scan data by scanning the constructed actual phantom model of teeth set (S30-2); and by comparing the scan data of the scanner with the three-dimensional position data of the virtual phantom model of teeth set, the present invention provides a method for assessing the precision of the 3D printing which includes the step of evaluating the precision of the 3D printing (S40-2). The scanner may be a contact or non-contact intraoral or extraoral scanner. Both the virtual phantom model of teeth set and the actual phantom model of teeth set may contain more than one dental model. The actual phantom model of teeth set may be the phantom model of teeth set. Neither the virtual phantom model of teeth set nor the actual phantom model of teeth set may include a dental model.

Effects of the Invention

Based on one embodiment of the present invention, the phantom model of teeth set has outstanding scanning qualities, allowing for a reliable evaluation of the accuracy of non-contact extraoral scanners and intraoral scanners as well as the accuracy of 3D printing. Consequently, the phantom model of teeth set may be utilized as a standard pattern model of teeth set for assessing the scanning precision of scanners or the precision of 3D printing.

BRIEF DESCRIPTION OF DRAWINGS

FIG. 1ae is a front view of the phantom model of teeth set of FIG. 1.

FIG. 1af is a rear view of the phantom model of teeth set of FIG. 1.

FIG. 1ag is a plane view of the phantom model of teeth set of FIG. 1.

FIG. 1ah is a bottom view of the phantom model of teeth set of FIG. 1.

FIG. 1ai is a right-side view of the phantom model of teeth set of FIG. 1.

FIG. 1aj is a left-side view of the phantom model of teeth set of FIG. 1.

IMPLEMENTATION MODE OF THE INVENTION

The following is a detailed description of the phantom model of teeth set according to one embodiment of the present invention and referring to the accompanying drawings.

In the current specifications, the term "tooth model" refers to an artificial tooth-shaped structure.

In addition, for the purposes of these specifications, "three-dimensional location data" refers to the spatial coordinates of any point, where the position of a point in space is defined as an ordered pair of three actual values (x, y, z). If the spatial coordinates of all points on the phantom model of teeth set are collected, it is possible to determine not only the overall form of the dental phantom model but also the position and 3D size of each tooth model as well as the distance between tooth models.

Moreover, for the purposes of this standard, "scan data" refers to 3D location data acquired by scanning with a scanner.

In addition, the term "virtual dental phantom model" in the current specification refers to a phantom model of teeth set (i.e., a drawing file such as CAD) made with a drawing application such as CAD.

The phrase "actual dental phantom model" in this specification also refers to a phantom model of teeth set with a physical shape constructed of a substance such as metal.

Figure 1A:
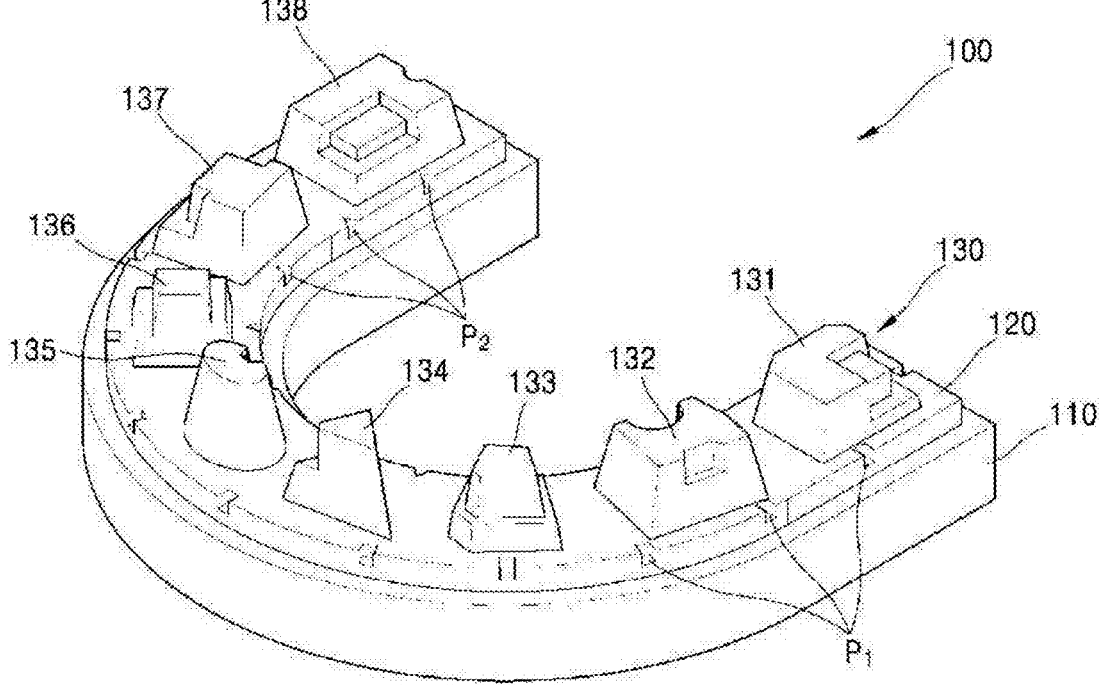
FIG. 1aa to 1ad are perspective views of the phantom model of teeth set according to one embodiment of the present invention.
Figure 1A:
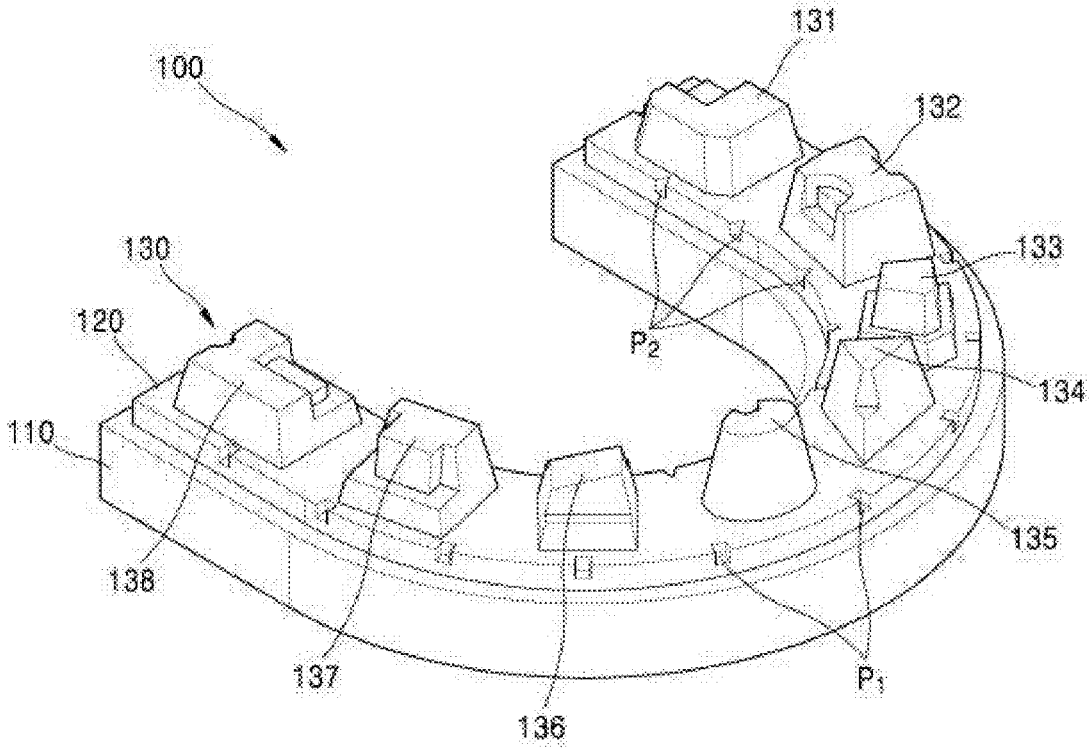
Figure 1A:
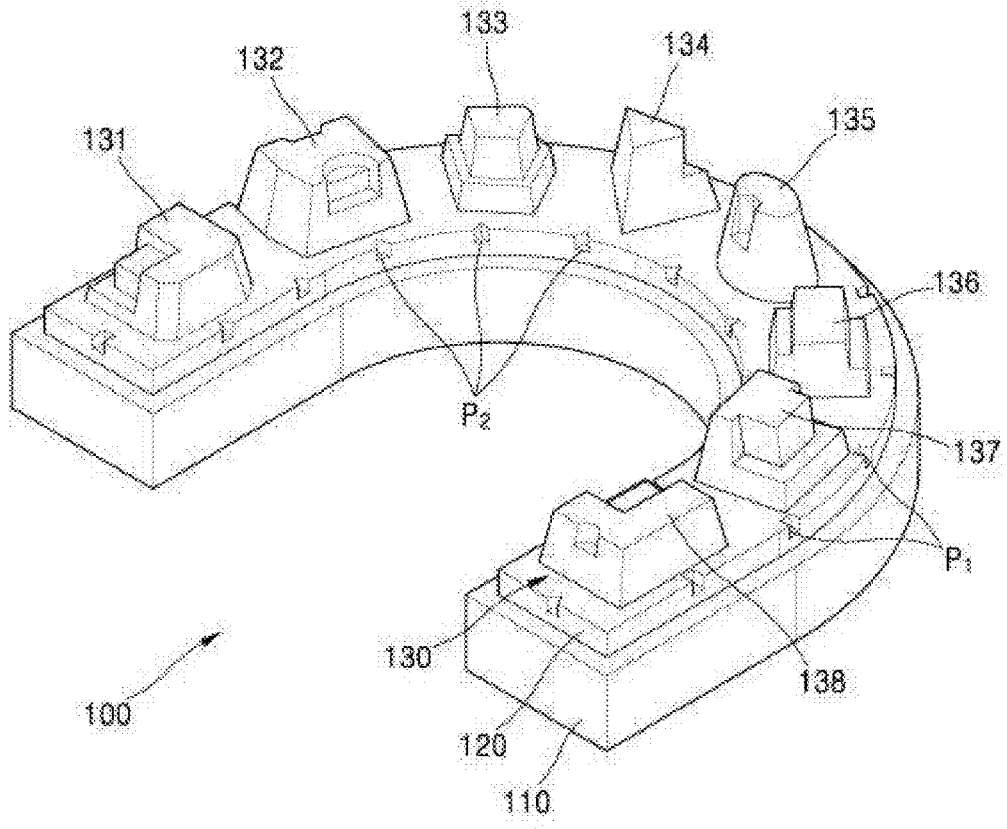
Figure 1A:
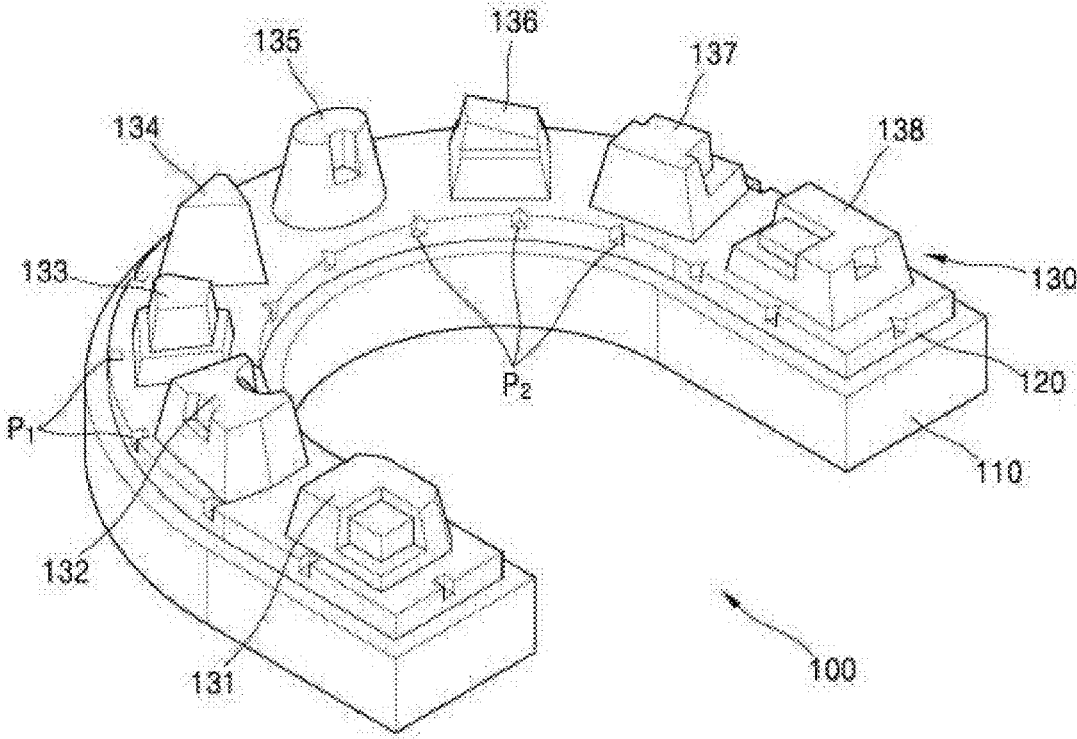
Figure 1A:
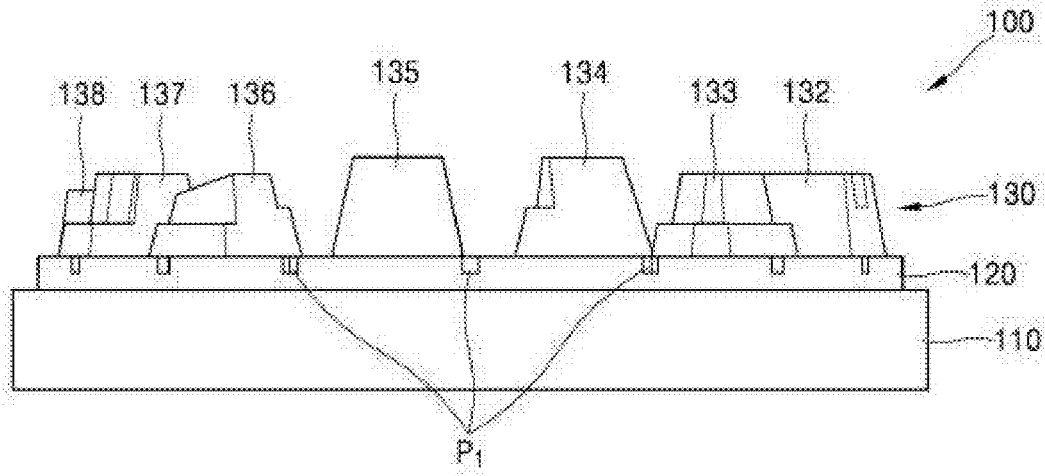
Figure 1A:
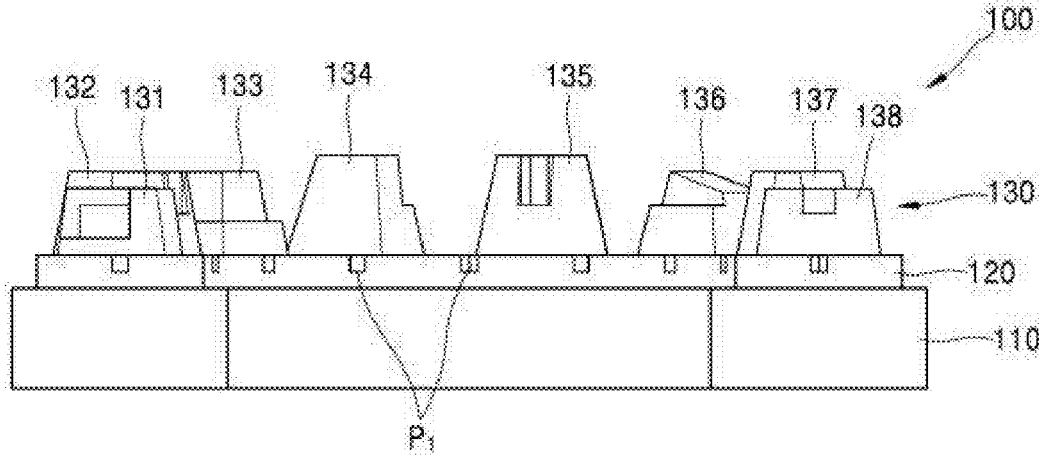
Figure 1A:
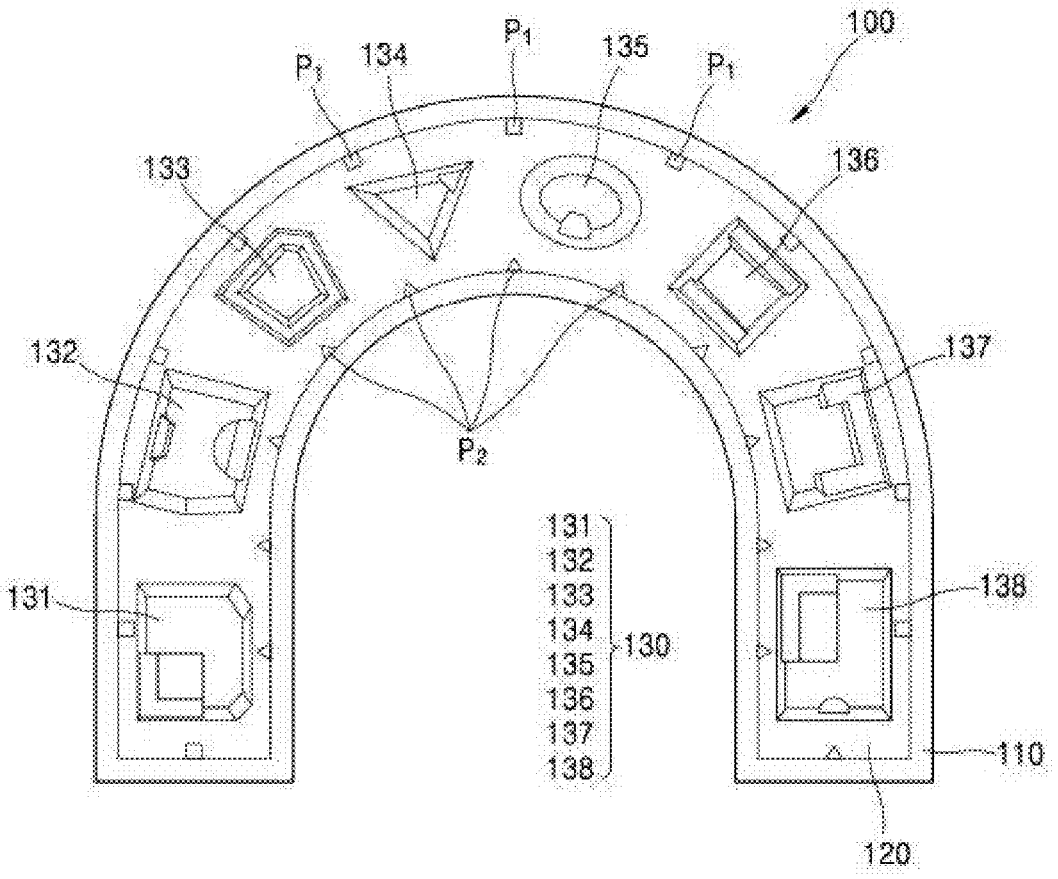
Figure 1A:
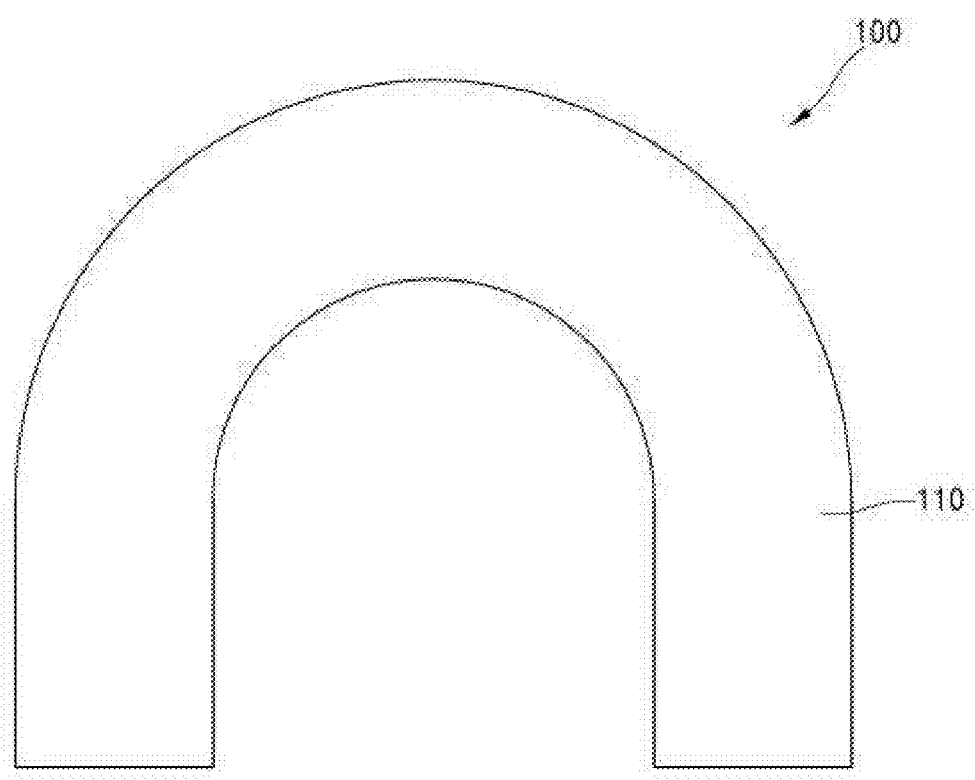
Figure 1A:
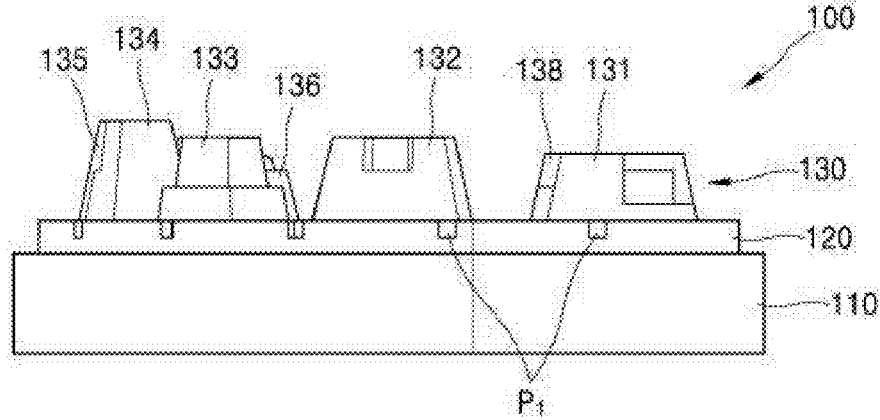
Figure 1A:
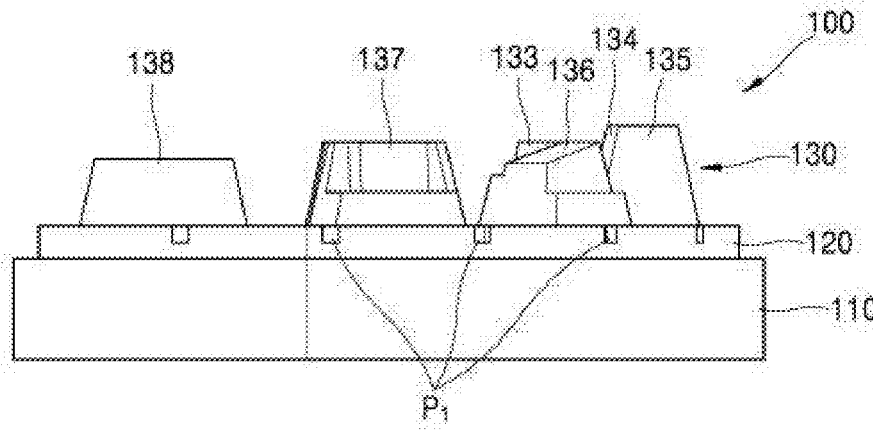

FIG. 1aa to 1ad are perspective views of a phantom model of teeth set according to an embodiment of the present invention; FIG. 1ae is a front view of the phantom model of teeth (100) set of FIG. 1; FIG. 1af is a rear view of the phantom model of teeth set (100) of FIG. 1; FIG. 1ag is a plane view of the phantom model of teeth set (100) of FIG. 1; FIG. 1ah is a bottom view of the phantom model of teeth set (100) of FIG. 1; FIG. 1ai is a right-side view of the phantom model of teeth set (100) of FIG. 1; and FIG. 1aj is a left-side view of the phantom model of teeth set (100) of FIG. 1.

In reference to FIG. 1, a phantom model of teeth set (100) according to an exemplary embodiment of the present invention includes the base layers (110 and 120) and a layer of teeth set (130).

The base layers (110 and 120) may include the first base layer (110) and the second base layer (120).

On top of the first base layer (110) that is to be stepped, the second base layer (120) may be constructed. Specifically, the width and length of the second base layer (120) can be made to be less than those of the first base layer (110).

Additionally, the second base layer (120) may further include one or more patterns (P1 and P2).

These patterns assist in further enhancing the dental phantom model's (100) scannability.

For instance, the patterns (P1 and P2) may have a star shape, a wavy shape, a dumbbell shape, or a polygon shape (triangle, square, pentagon, hexagon).

Moreover, when there are several patterns (P1 and P2), at least some of the patterns may be the same or at least some of the patterns may be different.

The patterns (P1 and P2) may also be grooves and/or protrusions.

In addition, the base layers (110 and 120) may be shaped to resemble a human gum.

In addition, metal may be included in the basal layers (110 and 120). As described previously, base layers (110 and 120) containing metals may alter (eg, improve) scanning characteristics.

The layer of teeth set (130) may be placed on the second base layer (120).

Also, the layer of teeth set (130) may include one or more tooth models. The layer of teeth set (130), for instance, may have one, two, or more tooth models. For example, as seen in FIG. 1, the layer of teeth set (130) may have eight tooth models (131~138).

Each tooth model (131~138) may be configured so that the shape observed in one direction differs from the form viewed in the opposite way. For instance, if each tooth model (131~138) has several faces (e.g., three or four), each tooth model (131~138) may be designed so that the form of each face is distinct from the shape of the other faces.

Additionally, three-dimensional position data may be created for each of the tooth models (131~138). For example, each tooth model (131~138) may be made using a 3D processing method (e.g., 3D printing, metal milling, etc.) and a computer-aided design (CAD) tool that generates a virtual phantom model of teeth set with three-dimensional position data. In contrast, due to the uneven form of natural teeth, it is not possible to assemble 3D position data in a dental model created by impression taking.

In addition, each tooth model (131~138) may be built so that the floor area (i.e., the area of the face in contact with the second base layer (120)) imitates the floor area of the corresponding natural tooth. For instance, the floor area of the tooth model (131) is greater than the floor area of the tooth model (132) which mimics actual teeth in terms of floor space.

Moreover, each tooth model may be designed to simulate natural dental trauma, such as enamel fracture, crown fracture, root fracture, tooth dislocation, tooth transection, fracture, and gingival injury.

Additionally, the phantom model of teeth set has many tooth models. Each tooth model (e.g., 131) may be set so that a shape seen in a random direction differs from shapes of other teeth models (e.g., 132~138), respectively.

For example, referring to FIGS. 1*ae*, 1*ag*, 1*ai*, and 1*aj*, each tooth model (e.g., 131) has the shapes observed from the front, back, planar, left and right-side shapes of the phantom model of teeth set (100) that may be constructed to be different from the corresponding shapes of the other dental models (e.g., 132~138) observed from the front, back, planar, left and right-side shapes of the phantom model of teeth set (100), respectively. Here, "corresponding shape" refers to the shape of a specific tooth model (e.g. 131) and the shape of additional teeth models (e.g., 132~138) seen in the same direction.

Moreover, each of the tooth models (131~138) may comprise one or more patterns (not shown).

The pattern aids in further enhancing the scannability of the phantom model of teeth set (100).

Moreover, each tooth model (131~138) may contain metal. By including the metal in each tooth model (131~138), the scanning characteristics may be altered (e.g., enhanced).

Following is a detailed description of a method for assessing the scanning precision of a scanner in accordance with an embodiment of the present invention.

The scanning accuracy assessment method of the scanner according to an embodiment of the present invention includes the following steps: generating a virtual phantom model of teeth set using three-dimensional position data using a computer-aided design (CAD) application (S10-1); using a 3D processing method (e.g., 3D printing, metal milling, etc.) to create an actual phantom model of teeth set based on a sketched virtual phantom model of teeth set (S20-1); obtaining scan data by scanning the created actual phantom model of teeth set with an extraoral non-contact scanner (S30-1) and comparing the scan data of the non-contact extraoral scanner with the three-dimensional position data of the virtual phantom model of teeth set (e.g. by overlapping), assessing the scanning precision of the non-contact extra-oral scanner (S40-1).

The virtual phantom model of teeth set may be a CAD file.

The non-contact extraoral scanner might be a model scanner, also known as a 3D scanner.

The greater the scanning accuracy of the non-contact extraoral scanner may be evaluated in step S40-1, the lower the deviation between the scan data of the non-contact extraoral scanner and the three-dimensional position data of the virtual dental phantom model.

In addition, the scanning precision evaluation method of the scanner may further include a step (S25) of obtaining three-dimensional position data of the actual phantom model of teeth set by scanning the actual phantom model of teeth set manufactured in the step (S20-1) with a contact-type extraoral scanner between the step (S20-1) and the step (S30-1). In this case, the step (S40-1) is conducted instead of comparing the scan data of the non-contact extraoral scanner with the three-dimensional position data of the virtual phantom model of teeth set and the scanning precision of the non-contact extraoral scanner may be determined by comparing it to the actual phantom model of teeth set's three-dimensional position data.

The contact extraoral scanner may be a 3D scanner.

In addition, the scanning precision evaluation method of the scanner, after step (S40-1), may include the following steps: scanning the actual phantom model of teeth set manufactured in step (S20-1) with an intraoral scanner to obtain scan data (S50-1) and comparing the acquired scan data of the intraoral scanner with the scan data of the non-contact extraoral scanner obtained in the step (S30-1) (e.g., by overlapping) to evaluate the scanning precision of the intraoral scanner (S60-1).

The greater the scanning precision of the intraoral scanner may be evaluated in step (S60-1) the lower the deviation between the scan data of the intraoral scanner and the scan data of the non-contact extraoral scanner.

The intraoral scanner may be a contact or non-contact 3D scanner.

The virtual phantom model of teeth set and the actual phantom model of teeth set, for example, may contain one or more dental models. The actual phantom model of teeth set in this scenario might be the previously described phantom model of teeth set (100).

As another example, both the virtual and actual phantom models of teeth set may not include a dental model. In this instance, the virtual phantom model and the actual phantom model of teeth set may only comprise the base layers (110 and 120) and not the layer of teeth set (130) of the aforementioned phantom model of teeth set (100).

Following is a detailed description of a 3D printing precision evaluation method according to an embodiment of the present invention.

Method for evaluating the precision of 3D printing based on an embodiment of the present invention comprises the following steps: Using a CAD application, a virtual phantom model of teeth set with three-dimensional position data is created (S10-2); using 3D printing to create an actual phantom model of teeth set based on a sketched virtual phantom model of teeth set (S20-2); obtaining scan data by scanning the created actual phantom model of teeth set with a scanner (S30-2) and evaluating the precision of 3D printing by comparing the scan data of the scanner with the three-dimensional position data of the virtual phantom model of teeth set (S40-2).

A 3D printer is capable of performing the 3D printing.

When the precision of the scanner is high, it may indicate the precision of the 3D printer and when the precision of the 3D printer is high, it may indicate the precision of the scanner. When both the 3D printer's accuracy and the scanner's precision are low, it may indicate the total precision.

The scanner may be a contact or non-contact 3D intraoral or extraoral scanner.

The greater the precision of 3D printing may be measured in step (S40-2), the lower the discrepancy between the scan data of the extraoral scanner and the three-dimensional position data of the virtual phantom model of teeth set.

The virtual phantom model and the actual phantom model of teeth set, for instance, may contain one or more dental models. In this instance, the actual phantom model of teeth set (100) may be the one described above.

As another example, both the virtual and actual phantom models of teeth set may not include a dental model. In this instance, the virtual phantom model and the actual phantom model of teeth set may only comprise the base layers (110 and 120) and not the layer of teeth set (130) of the aforementioned phantom model of teeth set (100).

Following will be a description of the current invention with reference to the following examples, however, the present invention is not limited to these examples alone.

Example 1 and Reference Examples 1-2: Manufacturing of a Phantom Model of Teeth Set The phantom model of teeth sets in the shapes shown in FIGS. 1ag, 2a, and 3a were manufactured using a CAD program and a 3D printer.

Examples of Evaluation

Each of the phantom models of teeth set was scanned using a 3Shape TRIOS 3 scanner to create a scanning image. The FIG. 1b is a scanning image of the phantom model of teeth set produced in Example 1, FIG. 2b is a scanning image of the phantom model of teeth set produced in Reference Example 1 and FIG. 3b is a scanning image of the phantom model of teeth set manufactured in Reference Example 2.

Figure 1B:
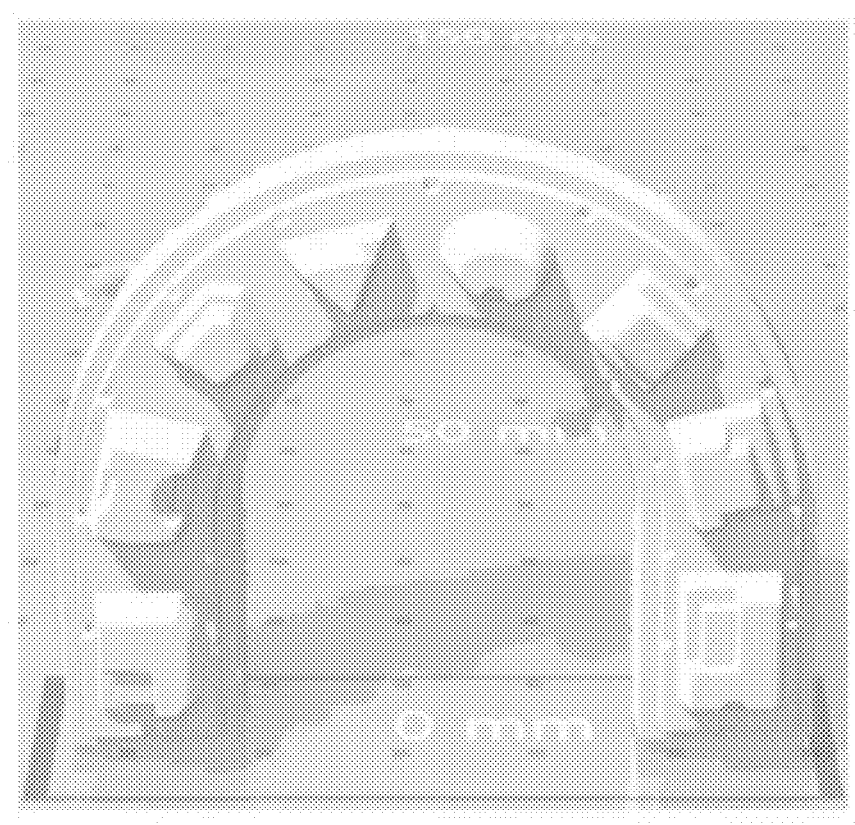
FIG. 1b is a scanning image of the phantom model of teeth set manufactured in Reference Example 1.

Using FIGS. 1ag and 1b as references, the scanned image of FIG. 1b (Example 1) demonstrated that the phantom model of teeth set is depicted in FIG. 1ag (Example 1) was flawlessly created.

Figure 2A:
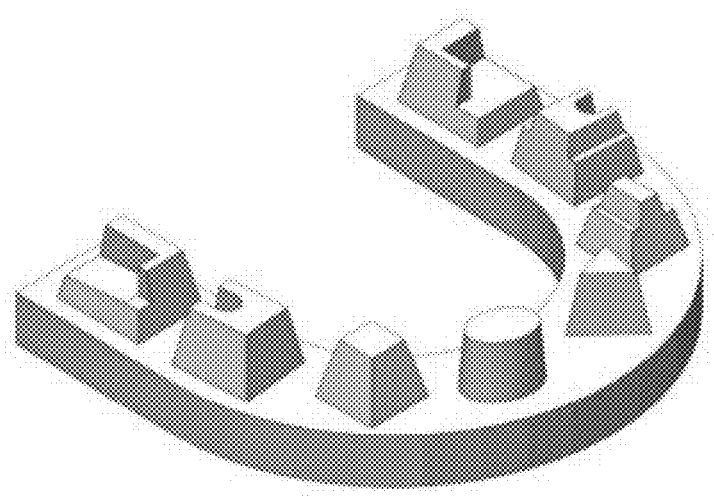
FIG. 2a is a perspective view of the phantom model of teeth set manufactured in Reference Example 1.
Figure 2B:
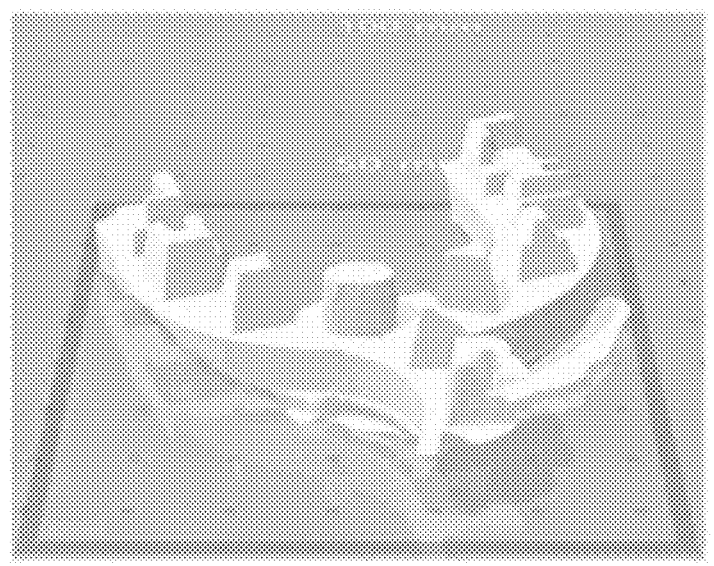
FIG. 2b is a scanning image of the phantom model of teeth set manufactured in Reference Example 1.

Referring to FIGS. 2a and 2b, it was discovered that the scanning image of FIG. 2b (Reference Example 1) hardly resembled the phantom model of teeth set of FIG. 2a (Reference Example 1).

Figure 3A:
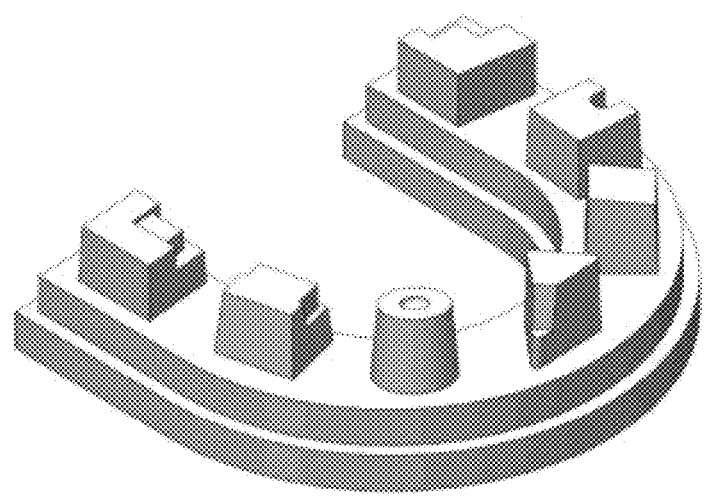
FIG. 3a is a perspective view of the phantom model of teeth set manufactured in Reference Example 2.
Figure 3B:
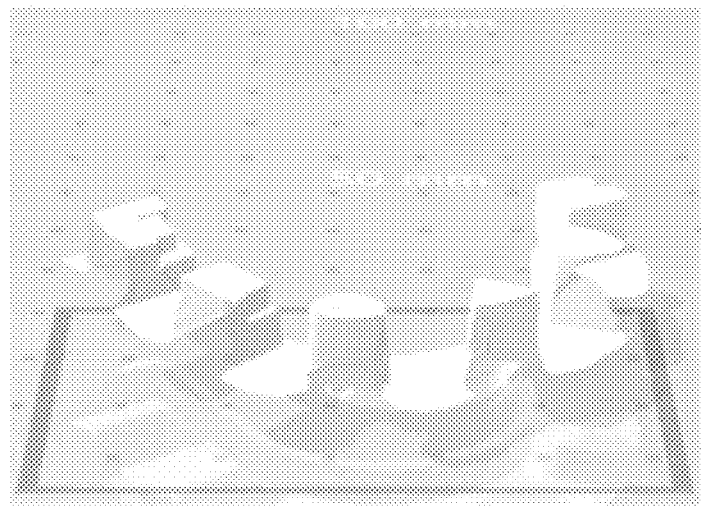
FIG. 3b is a scanning image of the phantom model of teeth set manufactured in Reference Example 2.

Similarly, referring to FIGS. 3a and 3b, it was discovered that the scanning image of FIG. 3b (Reference Example 2) resembled the phantom model of teeth set of FIG. 3a only vaguely (Reference Example 2).

Based on the above results, it can be proven that the phantom model of teeth set of Example 1 has outstanding scanning qualities and may thus be used as a standard dental pattern model for assessing the scanning accuracy of a scanner or the printing precision of 3D printing.

As observed in the scanning images of the phantom models of teeth set of Reference Examples 1 and 2, a phantom model of teeth set with a form even slightly different from the phantom model of teeth set of Example 1 has poor scanning qualities; hence, it is evident that this model cannot be used to evaluate the scanning quality of a scanner or the precision of 3D printing as a standard pattern model of teeth set.

The preferred embodiment of the present invention has been discussed with reference to the accompanying drawings, although this is simply illustrative. Those with ordinary competence in the field will recognize that several changes and equivalent alternative embodiments are feasible.

Consequently, the extent of protection afforded by the present invention must be specified by the attached claims.

8

DESCRIPTION OF CODES

| | |
|---|---|
| 100: Phantom Model of Teeth Set | 110: The First Base Layer |
| 120: The Second Base Layer | 130: Layer of Teeth Set |
| 131~138: Teeth Model | |

What is claimed is:

1. A phantom model of teeth set comprising:
a first base layer;
a second base layer formed on a top surface of the first base layer, such that the second base layer covers a majority of the top surface of the first base layer;
a plurality of patterns formed at both upper edges of the second base layer and configured to improve scanning accuracy; and
model teeth formed on a top surface of the second base layer, each model tooth being spaced apart from an adjacent model tooth such that the model teeth do not contact each other,
wherein a shape of each model tooth, when viewed from a front, rear, top, left, or right side, differ from a shape of any other one of the model teeth.

2. The phantom model of teeth set of claim 1, wherein each model tooth has a three-dimensional structure.

3. The phantom model of teeth set of claim 1, wherein the first base layer has a shape corresponding to a human gum.

4. The phantom model of teeth set of claim 1, wherein a floor area of each model tooth is greater than a top area of the respective model tooth.

5. The phantom model of teeth set of claim 1, wherein the first base layer, the second base layer, and the model teeth are made of metal.

6. A method of measuring the scanning precision of a scanner, comprising:
drawing, by a CAD application, the phantom model of teeth set of claim 1, the CAD application producing three-dimensional position data of the phantom model of teeth set;
forming a physical phantom model of teeth set using a 3D processing approach based on the phantom model of teeth set drawn by the CAD application;
acquiring first physical three-dimensional position data by scanning the physical phantom model of teeth set using a non-contact extraoral scanner; and
comparing the first physical three-dimensional position data with the three-dimensional position data produced by the CAD application to assess the scanning precision of the non-contact extraoral scanner.

7. The method of measuring the scanning precision of a scanner of claim 6, further including:
obtaining second physical three-dimensional position data by scanning the physical phantom model of teeth set using a contact-type extraoral scanner; and
comparing the first physical three-dimensional position data with the second physical three-dimensional position data, instead of the three-dimensional position data produced by the CAD application, to assess the scanning precision of the non-contact extraoral scanner.

8. The method of measuring the scanning precision of a scanner of claim 6, further including:
obtaining third physical three-dimensional position data by scanning the physical phantom model of teeth set using an intraoral scanner; and comparing the third physical three-dimensional position data with the first physical three-dimensional position data to evaluate the scanning precision of the intraoral scanner.

9. A method of measuring the 3D printing precision, comprising:

drawing, by a CAD program, the phantom model of teeth set of claim 1, the CAD program producing three-dimensional position data of the phantom model of teeth set;

3D-printing, by a 3D printer, a physical phantom model of teeth set based on the phantom model of teeth set drawn by the CAD program;

collecting physical three-dimensional position data by scanning the physical phantom model of teeth set using a scanner; and comparing the physical three-dimensional position data with the three-dimensional position data produced by the CAD program to assess the accuracy of the 3D printing.

10. The method of measuring 3D printing precision of claim 9, wherein the scanner is a contact type or a non-contact oral or extraoral scanner.

\* \* \* \* \*